United States Patent
Herz

(10) Patent No.: US 6,600,145 B1
(45) Date of Patent: Jul. 29, 2003

(54) ELECTRONIC AC VOLTAGE SWITCH

(75) Inventor: Manfred Herz, Mainz (DE)

(73) Assignee: IC-Haus GmbH, Bodenheim (DE)

(*) Notice: Subject to any disclaimer, the term of this patent is extended or adjusted under 35 U.S.C. 154(b) by 0 days.

(21) Appl. No.: 09/720,753

(22) PCT Filed: Feb. 10, 1999

(86) PCT No.: PCT/DE99/00385

§ 371 (c)(1),
(2), (4) Date: Dec. 27, 2000

(87) PCT Pub. No.: WO00/03483

PCT Pub. Date: Jan. 20, 2000

(30) Foreign Application Priority Data

Jul. 7, 1998 (DE) .................................... 298 12 092 U

(51) Int. Cl.⁷ ............................................. H01L 31/00
(52) U.S. Cl. .............................. 250/214 SW; 327/427
(58) Field of Search ..................... 250/214 SW, 551, 250/214.1, 214 R; 327/514, 434, 427

(56) References Cited

U.S. PATENT DOCUMENTS

| | | | | |
|---|---|---|---|---|
| 3,693,060 A | * | 9/1972 | Joyce | 250/551 |
| 4,888,504 A | | 12/1989 | Kinzer | |
| 5,559,466 A | * | 9/1996 | Okumura et al. | 327/514 |
| 5,615,146 A | * | 3/1997 | Gotou | 365/185.01 |
| 6,429,896 B1 | * | 8/2002 | Aruga et al. | 348/552 |

FOREIGN PATENT DOCUMENTS

| | | |
|---|---|---|
| DE | 295 03 130 U1 | 6/1995 |
| DE | 195 34 045 A1 | 3/1997 |
| EP | 0 497 471 A2 | 8/1992 |
| EP | 0 637 875 A1 | 2/1995 |

OTHER PUBLICATIONS

Kaifler, Erich; Mollmer, Frank; Tihanyi Jeno; Grundschaltungen mit Sipmos–Fet–Treibern, TECHNIK, Siemens Components, 1989.

* cited by examiner

*Primary Examiner*—Que T. Le
*Assistant Examiner*—Thanh X. Luu
(74) *Attorney, Agent, or Firm*—Edward Dreyfus

(57) ABSTRACT

The invention relates an electronic switch for switching on and off high AC voltage between two connecting terminals. The switch includes two series-connected MOS floating gate transistors (20, 30; 20', 30'), that can block and establish the transmission path between the applied high AC voltage connecting terminals. A charge storage device (24, 27, 34, 37; 24', 34', 60) stores charges and is connected to each gate of the MOS transistors. Each charge storage device (24, 27, 34, 37; 24', 34', 60) is assigned a charge feeding device (40, 50; 50) for applying a predetermined quantity of charge to the charge storage device (24, 34; 24', 34'), which corresponds to a first switching state, and for removing a predetermined quantity of charge from the charge storage device, which corresponds to a second switching state. In this way, very low energy sensor outputs control high power AC voltage applied to the connecting terminals. This switch has utility in the automotive and other industries.

14 Claims, 3 Drawing Sheets

ELECTRONIC AC VOLTAGE SWITCH

Figure 1:
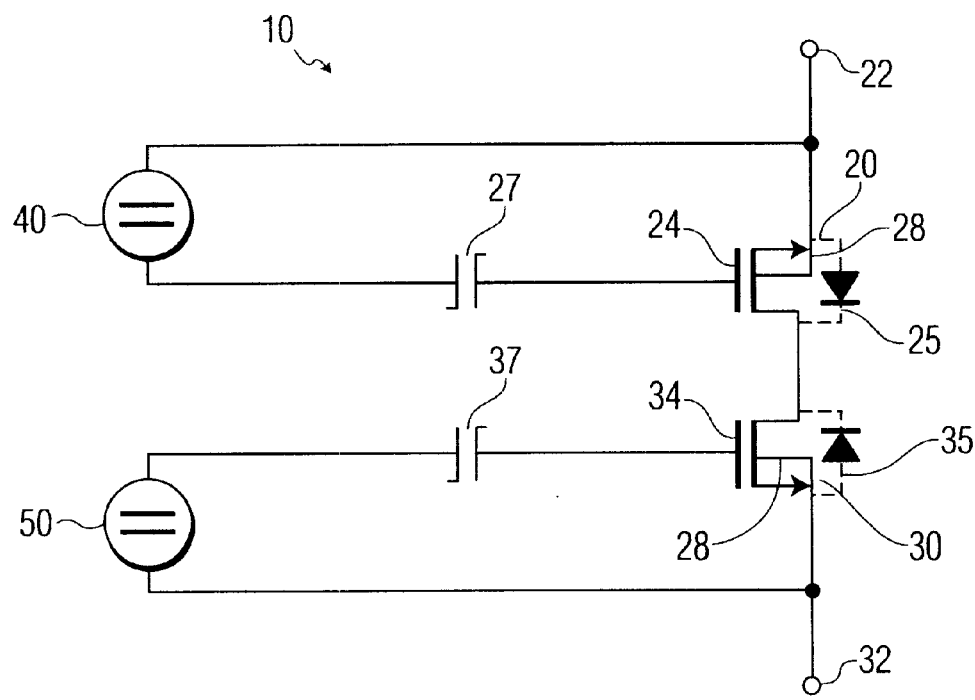

The invention relates to an electronic AC voltage switch according to claim 1.

In order to switch large AC voltages (e.g. 60 V) or high AC currents (greater than 1 A), use is primarily made of mechanical AC voltage switches. However, since electronics have successfully been adopted in numerous sectors, thus including the automotive sector, there is a need to develop electronic AC voltage switches for high powers.

The invention is based on the object, therefore, of providing an electronic AC voltage switch which is designed for high powers and can be operated with the least possible energy.

The invention solves this technical problem by means of the features of claim 1.

Charge-dependent MOS transistors which can be driven without any power are appropriate for this purpose. According to the invention, the electronic AC voltage switch has two series-connected MOS transistors, such that the latter can block and transmit an applied AC voltage. In other words, the series-connected MOS transistors can be controlled to assume a high-impedance state and a low-impedance state. At least one device for storing charges is connected to the gate connections of the MOS transistors. Furthermore, a charge feeding device is assigned to each charge storage device for applying a predetermined quantity of charge to the charge storage devices, which corresponds to a first switching state, and for removing a predetermined quantity of charge from the charge storage devices, which corresponds to a second switching state.

Advantageous developments are specified in the subclaims.

In order to be able to produce an electronic AC voltage switch cost-effectively, it is possible to have recourse to components—known per se—which are constructed with a floating gate as charge storage device, such as a floating gate field-effect transistor for example. In this case, the floating gate is embedded in an oxide, so that it serves as a charge store for charges which are applied by way of the tunnel effect for example. Floating gate field-effect transistors are used, inter alia, in large numbers as memory cells in electrically erasable programmable read-only memories (EEPROMs). In this way, the switching state of the electronic AC voltage switch can be held or stored even without the permanent application of an external voltage source.

In one embodiment, two MOS transistors of the n-channel type are connected in series in opposite directions such that the source connections of the MOS transistors form the connecting terminals of the electronic AC voltage switch. Accordingly, the MOS transistors have a common drain connection. Furthermore, each MOS transistor is assigned a separate floating gate which is respectively assigned a charge feeding device.

In order to be able to further simplify the construction of the AC voltage switch and thus to reduce the production costs, two n-type MOS transistors are connected in series such that the drain connections of the MOS transistors form the connecting terminals of the electronic AC voltage switch. As a result, the MOS transistors have a common source connection and can be produced with a common oxide. Accordingly, it is also the case that only one charge feeding device is required.

Customary voltage sources which can be connected externally can be used as charge feeding devices.

However, since only small quantities of charge are necessary for switching the electronic AC voltage switch in MOS technology and the duration of the switch-on processes is insignificant, it is possible to use charge feeding devices which only generate small currents.

Such a device may be designed as an optoelectronic component which converts incident light into an electric current.

By way of example, the optoelectronic component comprises at least one first photodiode, such as e.g. a PIN diode, having a first wavelength-dependent sensitivity, and at least one second photodiode connected in parallel with the first photodiode and having a second wavelength-dependent sensitivity, the first photodiode and the second photodiode being connected with opposite polarity. Depending on the wavelength of the incident radiated light, charges are applied to the floating gates or removed therefrom and the switching state of the electronic AC voltage switch is thus defined. Laser diodes or LEDs which generate light at the corresponding wavelengths can be used as light sources. By using photodiodes as charge feeding devices, it is possible to produce the electronic AC voltage switch together with the charge feeding device as an integrated module.

As an alternative, the charge feeding device can also be embodied by a mechanical/electrical device comprising a number of piezoelectric elements for example. The piezoelectric elements are connected in parallel with one another and with opposite polarity and are connected in series with the MOS transistors. Two zener diodes which are connected in opposite directions are connected in parallel with the piezoelectric elements for the purpose of voltage limiting and thus for the purpose of protecting the gate. In this embodiment, the switching state of the AC voltage switch is controlled by mechanical deformation of one of the two piezoelectric elements.

The switching state is controlled as follows: charges pass to the floating gates as a result of mechanical pressure on one piezoelectric element, and charges are removed from the floating gates as a result of the action of force on the other piezoelectric element.

This possibility for supplying charge is in turn opened up by the low demand of the electronic AC voltage switch for charge carriers. A piezoelectric element can only provide very small currents, but this is sufficient for this application.

Figure 2:
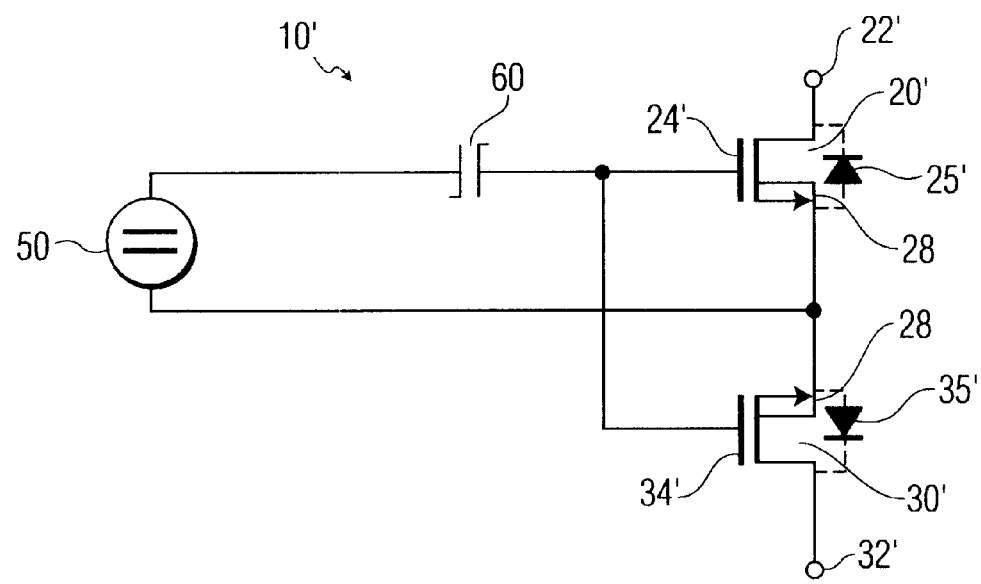
Figure 3:
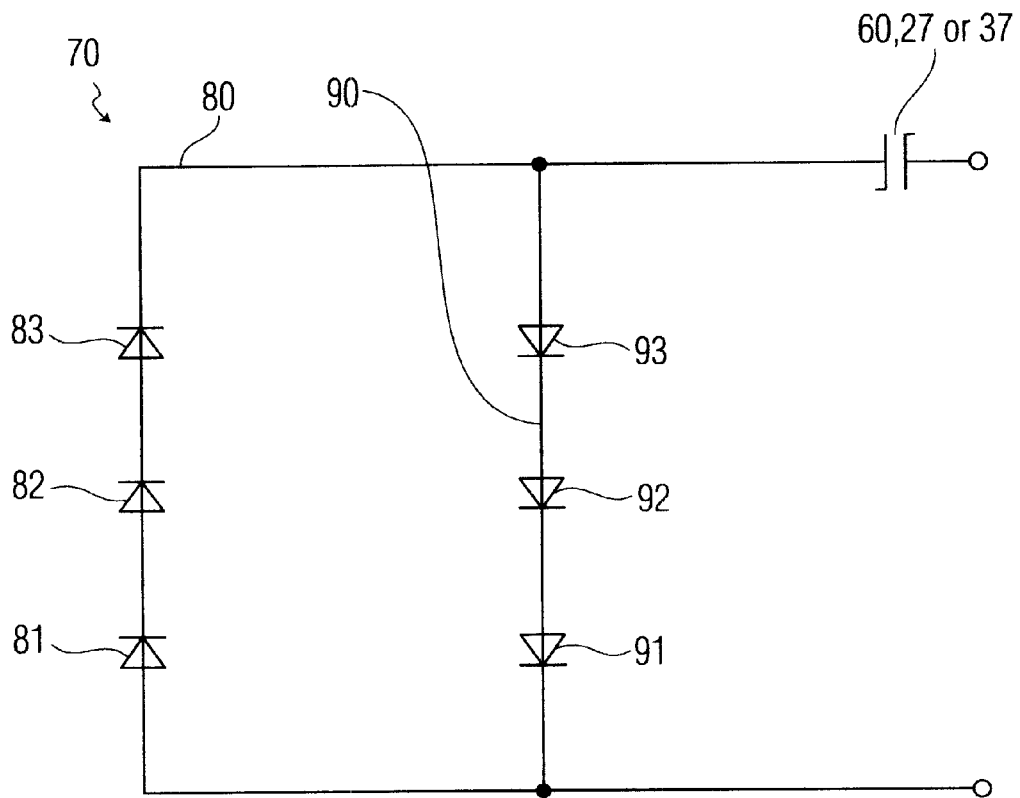
Figure 4:
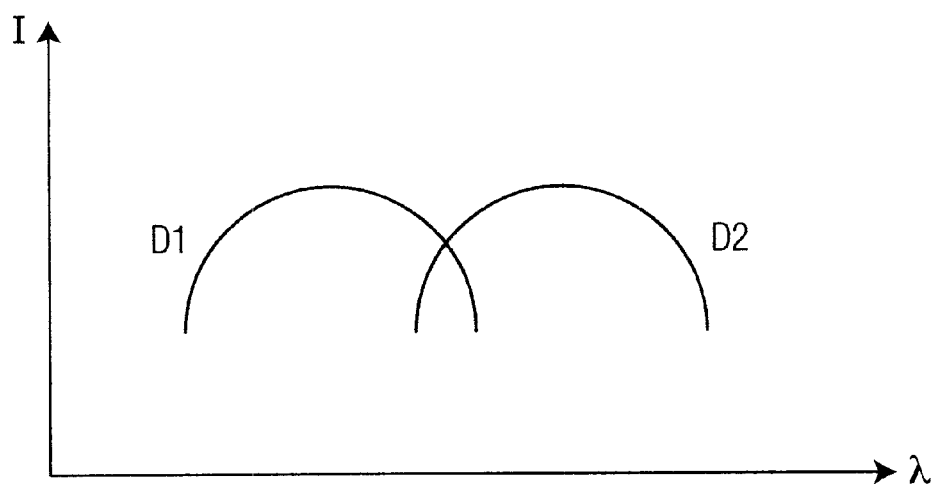
Figure 5:
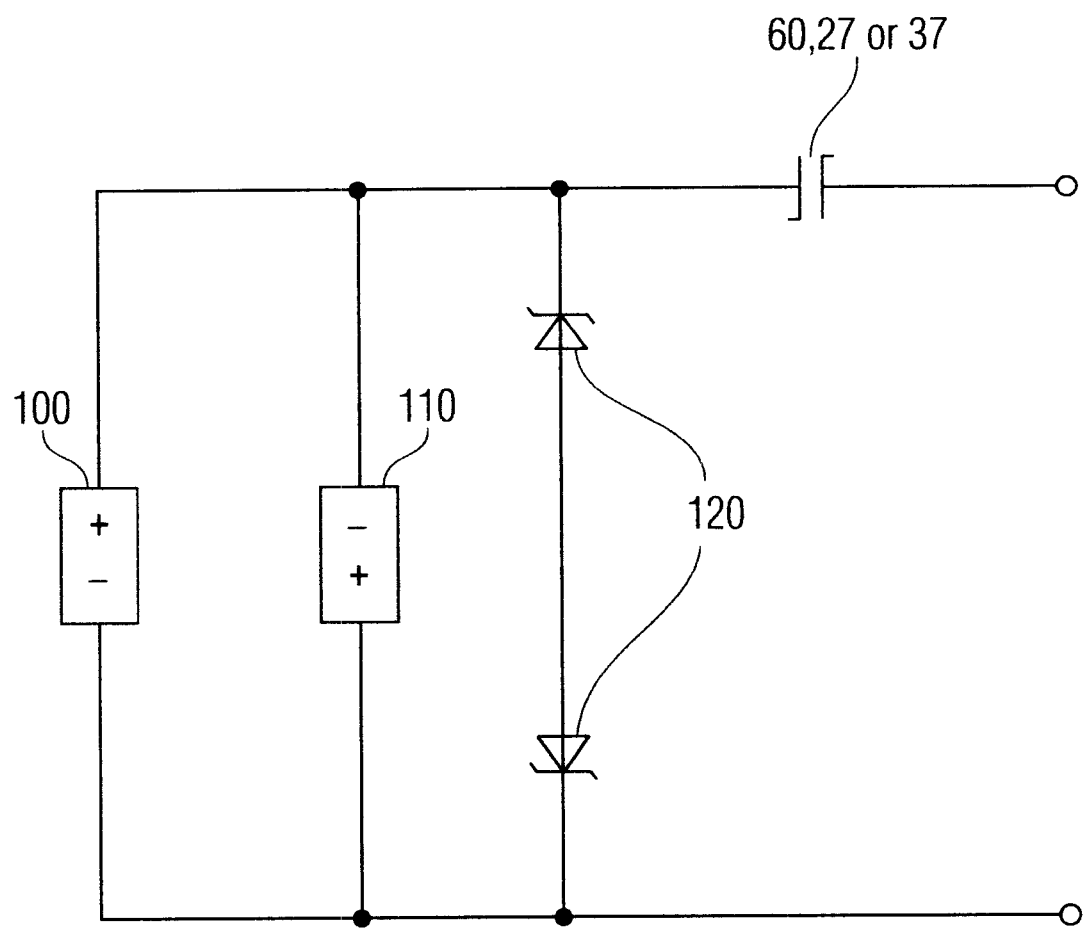

The invention is explained in more detail below using the exemplary embodiments in conjunction with the accompanying drawings, in which:

FIG. 1 shows the electrical equivalent circuit diagram of an exemplary electronic AC voltage switch, FIG. 2 shows the electrical equivalent circuit diagram of a further exemplary electronic AC voltage switch, FIG. 3 shows an alternative embodiment of the charge feeding device shown in FIG. 2, FIG. 4 shows a diagram of the wavelength-dependent intensity profile of the diode arrangement shown in FIG. 3, FIG. 5 shows a further alternative embodiment for the charge feeding device shown in FIG. 2.

FIG. 1 illustrates an electronic AC voltage switch 10 having two n-type MOS transistors 20, 30 connected in series. In a manner known per se, each MOS transistor has a source and drain zone, an intervening bulk region 28 and a gate zone. The MOS transistors 20 and 30 are connected to one another via their drain electrodes, so that the respective source connections 22 and 32 of the MOS transistors 20 and 30 constitute the connecting terminals of the electronic AC voltage switch 10, to which the AC voltage to be switched can be applied. Each MOS transistor is constructed in a similar manner to an EEPROM cell, i.e. each MOS transistor 20, 30 contains a floating gate 24 and 34, respectively, as charge storage devices, which floating gates can be charged and discharged via a tunnel oxide 27 and 28, respectively, for example. On account of the production process, a parasitic diode 25 and 35 forms in parallel with the drain-source channel when the bulk region 28 is connected to the source zone of the respective transistor 20, 30, the anode of which diode is in each case connected to the source connection and the cathode of which diode is in each case connected to the drain connection of the respective MOS transistor. On account of the chosen series circuit of the MOS transistors 20, 30 with a common drain connection, the diodes 25 and 35 are connected in opposite directions. A respective voltage source 40 and 50 is provided for the purpose of applying charges to the floating gates 24 and 34. Since the process of applying charges to a floating gate and of removing charges from a floating gate is known per se, it will not be discussed in any further detail. By virtue of the use of two MOS transistors 20, 30, the electronic AC voltage switch 10 is driven in a charge-dependent manner and without any power. Since each MOS transistor is assigned a floating gate, the circuit state can be maintained even when the external voltage source 40 and 50, respectively, is switched off.

The method of operation of the electronic AC voltage switch according to FIG. 1 is described briefly below.

The two MOS transistors 20 and 30 are put into a conducting, i.e. low-impedance, state by the application of a predetermined quantity of charge to the floating gate 24 of the MOS transistor 20 by means of the voltage source 40 and to the floating gate 34 of the MOS transistor 30 via the voltage source 50. An AC voltage applied to the connecting terminals 22 and 32 is thus switched through. Even if the voltage sources 40 and 50 are set to 0 Volts, the closed switch state is preserved on account of the charges stored in the respective floating gate 24, 34. The charges are dissipated from the floating gates 24 and 34 for example by means of the tunnel effect by polarity reversal of the charge feeding devices. As a result of this operation of discharging the two floating gates 24 and 34, the MOS transistors 20 and 30, respectively, are switched to a high-impedance state. The electronic AC voltage switch 10 thus blocks an applied AC voltage. In this case, the source-drain path of each MOS transistor has a high impedance and the two connecting terminals 22 and 32 are connected to one another via the parasitic diodes 25 and 35. However, since the diodes 25, 35 are connected together with opposite polarity, the electronic AC voltage switch 10 remains at high impedance for an applied AC voltage.

FIG. 2 shows an AC voltage switch 10' which is further simplified by comparison with the electronic AC voltage switch 10 illustrated in FIG. 1 and once again has two n-type MOS transistors 20' and 30' connected in series, but this time the said transistors have a common source electrode.

In this case, the drain electrodes of the MOS transistors form the connecting terminals 22' and 32' for the electronic AC voltage switch 10'. A further difference from the electronic AC voltage switch 10 shown in FIG. 1 is that the electronic AC voltage switch 10' contains merely a single tunnel path 60, which is assigned to the two MOS transistors 20' and 30'. Accordingly, it is also the case that only one voltage source 50 is necessary for applying charges to the respective floating gates 24' and 34'.

Parasitic diodes 25' and 35' once again form in the MOS transistors 20' and 30', respectively, during the production of the electronic AC voltage switch 10', which diodes are connected with opposite polarities with respect to one another on account of the common source connection of the two MOS transistors 20' and 30'. The method of operation of the electronic AC voltage switch 10' corresponds to the method of operation of the electronic AC voltage switch 10 shown in FIG. 1, only one common tunnel path 60 being used instead of two tunnel paths, 27 and 37.

The replacement of mechanical AC voltage switches by the electronic AC voltage switch 10 or 10' described here succeeds in particular when a low internal resistance can be achieved in the on state and a high reverse voltage can be achieved in the off state. Both requirements are fulfilled by realizing the MOS transistors as DMOS type in a BCD (bipolar-CMOS-DMOS) process.

FIG. 3 illustrates an alternative embodiment for applying a quantity of charge to the floating gates 24' and 34' of the AC voltage switch 10' shown in FIG. 2. Instead of the electrical driving of the AC voltage switch 10' by means of the voltage source 50, the charge is applied to the floating gates 24' and 34' by coupling in light via the tunnel path 60. To that end, an optoelectronic charge feeding device 70 is proposed, which comprises, for example, two photodiode arrangements 80 and 90 connected in parallel. By way of example, the photodiode arrangement 80 contains three series-connected photodiodes 81, 82 and 83, whose maximum light sensitivity lies in the red wavelength range for example. The tunnel path 60 is assigned the cathode connection of the photodiode 83, while the anode connection of the photodiode 83 is connected to the cathode connection of the photodiode 82. The anode connection of the photodiode 82 is connected to the cathode connection of the photodiode 81, whose anode connection is at reference-earth potential. The photodiode device 90 likewise comprises three photodiodes 91, 92 and 93, which, however, are connected in the opposite forward direction with regard to the photodiodes 81, 82 and 83. The light sensitivity of the photodiodes 91, 92 and 93 lies in the infrared wavelength range for example. The photodiodes are advantageously semiconductor diodes, such as PIN diodes, for example, so that not only the AC voltage switch 10' but also at least part of the charge feeding device 70 can be produced in an integrated module. The wavelength-dependent sensitivity range of the photodiode arrangements 80 and 90 is illustrated in FIG. 4. In FIG. 4, the abscissa denotes the wavelength of the incident radiated light, and the ordinate denotes the current intensity. The curve profile designated by D1 is associated with the photodiode arrangement 80, whereas the curve profile designated by D2 is associated with the photodiode arrangement 90.

The replacement of the conventional electrical voltage sources 40 and 50 by an electro-optical charge feeding device 70 is possible since the electronic AC voltage switch 10 or 10' requires only a small amount of charge for changing the switching state and the duration of the switch-on process is not critical with respect to time. In order to apply charges to the floating gates 24' and 34', the photodiode arrangement 90 is irradiated with infrared light. The AC voltage switch 10' is now in the switched-on, i.e. low-impedance, state. In order to discharge the floating gates 24' and 34', the photodiode arrangement 80 is irradiated with red light. The MOS transistors 20' and 30' are now put into a blocking state, so that the two connecting terminals 22' and 32' are connected to one another via the parasitic diodes 25' and 35' connected in opposite directions. This again ensures that the electronic AC voltage switch 10' remains at a high impedance for an applied AC voltage. Since the photodiodes 91, 92, 93 have a maximum light sensitivity in the infrared range and the photodiodes 81, 82, 83 have a maximum light sensitivity in the red wavelength range, the charging and discharging operations of the floating gates 24' and 34' are essentially decoupled.

FIG. 5 shows a further alternative charge feeding device comprising, for example, two piezoelectric elements 100, 110 connected in parallel. Two zener diodes 120 which are connected in parallel therewith and in opposite directions serve as a voltage limiter in order to protect the tunnel path 60 and hence the electronic AC voltage switch 10' connected downstream against voltage spikes. In this example, charges are applied to and removed from the floating gates 24' and 34' in a pressure-controlled manner by deformation of the corresponding piezoelectric elements 100, 110.

The replacement of the conventional electrical voltage sources 40 and 50 as depicted in FIG. 1 by an electrical/mechanical device is also possible.

What is claimed is:

1. Electronic AC voltage switch comprising:
   two series-connected MOS transistors, each transistor having a gate connection for blocking and establishing part of a series transmission path between a pair of connecting terminals (22, 32) said terminals being connected to an applied AC voltage,
   at least one device for storing charges, which device is connected to a respective gate connection of the MOS transistors,
   a common charge feeding device coupled to each charge storage device for applying a predetermined quantity of charge to the charge storage device, which corresponds to a first switching state, and for removing a predetermined quantity of charge from the charge storage device, which corresponds to a second switching state, and wherein
   each charge storage device comprises a floating gate.

2. Electronic AC voltage switch according to claim 1, characterized in that the two MOS transistors are of the n-channel type and have a common source connection and a common oxide under each respective floating gate.

3. Electronic AC voltage switch according to one of claim 1 or 2, characterized in that the charge feeding device is an optoelectronic device.

4. Electronic AC voltage switch according to claim 3, characterized in that the optoelectronic device includes a first device comprising at least one photocell having a first wavelength-dependent sensitivity, and a second device connected in parallel with the first device and comprising, at least one photocell having a second wavelength-dependent sensitivity, the photodiode of the first device and the photodiode of the second device being connected with opposite polarity.

5. Electronic AC voltage switch according to one of claim 1 or 2, characterized in that the charge feeding device is a mechanical/electrical device.

6. Electronic AC voltage switch according to claim 5, characterized in that the mechanical/electrical device has at least a first and a second piezoelement connected with opposite polarity and in parallel with one another.

7. Electronic AC voltage switch according to claim 1, characterized in that the said series-connected MOS transistors comprise DMOS transistors and are or are not produced as an integrated module.

8. Electronic AC voltage switch comprising:
   two series-connected MOS transistors, each transistor having a gate connection for blocking and establishing part of a series transmission path in series with a pair of connecting terminals (22, 32), said terminals being connected to an applied AC voltage,
   two devices for storing charges, each device being coupled to a respective gate connection of the MOS transistors,
   each charge storage device coupled to a separate charge feeding device for applying a predetermined quantity of charge to the charge storage device corresponding to a first switching state, and for removing a predetermined quantity of charge from the charge storage device corresponding to a second switching state, and wherein each charge storage device is a floating gate.

9. Electronic AC voltage switch according to claim 8, characterized in that the two MOS transistors are of the n-channel type and have a respective oxide and a common drain connection, and wherein each gate connection is coupled to the respective floating gate.

10. Electronic AC voltage switch according to claim 8, or 9, characterized in that the charge feeding device is an optoelectronic device.

11. Electronic AC voltage switch according to claim 10, characterized in that the optoelectronic device includes a first device which comprises at least one photocell having a first wavelength-dependent sensitivity, and a second device connected in parallel with the first device and comprises at least one photocell having a second wavelength-dependent sensitivity, the photodiode of the first device and the photodiode of the second device being connected with opposite polarity.

12. Electronic AC voltage switch according to one of claim 8, or 9, characterized in that the charge feeding device is a mechanical/electrical device.

13. Electronic AC voltage switch according to claim 12, characterized in that the mechanical/electrical device has at least a first and a second piezoelement, which elements are connected with opposite polarity and in parallel with one another.

14. Electronic AC voltage switch according to claim 8, characterized in that the said switch contains DMOS transistors and can be produced as an integrated module.

* * * * *